United States Patent [19]

Nagata et al.

[11] Patent Number: 5,395,735
[45] Date of Patent: Mar. 7, 1995

[54] OPTICAL INFORMATION RECORDING MEDIUM AND METHOD OF MANUFACTURE

[75] Inventors: Kenichi Nagata, Minou; Eiji Ohno; Noboru Yamada, both of Hirakata, all of Japan

[73] Assignee: Matsushita Electric Industrial Co., Ltd., Osaka, Japan

[21] Appl. No.: 48,960

[22] Filed: Apr. 12, 1993

Related U.S. Application Data

[63] Continuation of Ser. No. 730,823, Jul. 26, 1991, abandoned.

[30] Foreign Application Priority Data

Sep. 28, 1989 [JP] Japan ............... 253357
Mar. 23, 1990 [JP] Japan ............... 73732
May 8, 1990 [JP] Japan ............... 118894

[51] Int. Cl.$^6$ .................. G11B 7/24; G11B 7/26
[52] U.S. Cl. .................. 430/270; 430/19; 430/945; 369/245.1; 369/288; 204/298.02; 204/192.2
[58] Field of Search ........... 204/298.02, 192.2; 346/135.1; 369/245.1, 288; 430/19, 495, 945, 270

[56] References Cited

U.S. PATENT DOCUMENTS

| | | | |
|---|---|---|---|
| 4,425,570 | 1/1984 | Bell et al. | 430/19 |
| 4,647,944 | 3/1987 | Gravesteijn et al. | 346/189.1 |
| 4,670,345 | 6/1987 | Morimoto et al. | 346/135.1 |
| 4,719,594 | 1/1988 | Young et al. | 430/945 |
| 4,788,097 | 11/1988 | Ohara et al. | 430/495 |
| 4,788,561 | 11/1988 | Nishino et al. | 346/135.1 |
| 4,879,205 | 11/1986 | Suzuki | 430/945 |
| 4,975,355 | 12/1990 | Suzuki | 430/945 |
| 5,015,492 | 5/1991 | Venkatessan et al. | 427/53.1 |
| 5,017,277 | 5/1991 | Yoshida et al. | 204/298.02 |
| 5,024,910 | 6/1991 | Ohta et al. | 346/135.1 |
| 5,034,255 | 7/1991 | Shigematsu et al. | 428/64 |
| 5,058,061 | 10/1991 | Koshino et al. | 430/945 |
| 5,065,697 | 11/1991 | Yoshida et al. | 204/298.02 |
| 5,194,363 | 3/1993 | Yoshioka et al. | 430/495 |

FOREIGN PATENT DOCUMENTS

| | | |
|---|---|---|
| 57-208648 | 12/1982 | Japan. |
| 58-77042 | 5/1983 | Japan. |
| 60-177446 | 9/1985 | Japan. |
| 62-53886 | 3/1987 | Japan. |
| 62-97885 | 5/1987 | Japan. |
| 0646578 | 1/1986 | U.S.S.R. .......... 204/298.02 |

OTHER PUBLICATIONS

Coughlin, T. M. "Nitrogen-Induced ... " J. Vac. Sci. technol. (Feb. 1982) 171-174.

Primary Examiner—Charles L. Bowers, Jr.
Assistant Examiner—Martin Angebranndt
Attorney, Agent, or Firm—Wenderoth, Lind & Ponack

[57] ABSTRACT

By forming recording layer (3), or recording material particles (10), (13) dispersed in protection material (9) with the laser sputtering, the initialization of recording layer (3) become, unnecessary or easy, and optical storage medium having long repetition life of recording and erasing is obtained.

10 Claims, 6 Drawing Sheets

Fig. 1

Laser Beam

Fig. 2

Laser Beam

Fig. 3

Laser Beam

Fig. 4

Laser Beam

$Ge_x Sb_y Te_z$ $0.10 \leq x \leq 0.35$   $0.10 \leq y$
$0.45 \leq z \leq 0.65$   $x + y + z = 1$

Fig. 14

OPTICAL INFORMATION RECORDING MEDIUM AND METHOD OF MANUFACTURE

This application is a continuation application of Ser. No. 07/730,823, filed Jul. 26, 1991, now abandoned.

Technical Field

This invention relates to an optical recording (or data data storage) medium used on an information record and reproduction unit employing laser beam, especially rewritable optical disk, and the method of manufacturing the same.

BACKGROUND ART

As an optical recording disk, which can record, reproduce, and erase information or data, an optical disk of phase change type having chalcogenide as its recording layer material is known (e.g. U.S. Pat. No. 3,823,386). Generally, crystallized state of the recording layer is treated as non-recording state, and, recording signals are attained by rapid heating and rapid cooling of the material to change it to amorphous state. Also, by heating to set back to crystallized state again, signals are erased. Recording layer, if formed by usual layer-forming method, is formed as amorphous state, and, accordingly, as far as the above-described recording system is adopted, recording layer is to be crystallized beforehand. Usually, this crystallization process is called initialization.

For the initialization, methods using various types of energies are known, as is shown in Patent Gazette of Japanese Patent Laid-open No. Sho 47-26897; for example, electric energy, radiation heat, light of photo flash lamp, laser beam energy, etc.

On the other hand, methods are proposed to make the initialization unnecessary, in which a recording layer of crystallized state is obtained by heating the substrate while forming the film.

As the structure of the optical disk, it is usual to provide a protection layer adjoining to the recording layer to protect the latter from the environment such as oxygen, water, and so on. Also, in order to improve repetition capability of recording and erasing, such structure as to disperse the recording material particles into the thermally stable protective material is proposed (e.g. U.S. Pat. No. 4,621,032, Patent Gazette of Japanese Patent Laid-open No. Sho 57-208648, and Sho 62-226438). The theory of these conventional technology is that, if the recording material particle in the thermally stable protection layer is melted by radiation of laser beam, constituent element of the recording material can move only within the limited space of "particle", and, therefore, if the particle size is sufficiently small, movement of the element of the recording material is not accumulated, or deterioration by the repetition of recording and erasing does not result. As the method to disperse recording material into the protection material, co-deposition of recording material and base material, or sputtering with plural sputter targets is proposed.

As the method of film-forming for each layer of the optical disk, electron beam deposition, sputtering, or CVD is well known, and these method can provide optical information recording medium having satisfactory characteristics for practical use, according to some reports. These, however, still had the following subjects.

For instance, in view of mass production, it is desirable that the layer forming of the recording layer and the initialization therefor are simultaneously carried out. However, if the recording layer is formed, while heating the substrate, to get the layer in crystallized state, it is necessary to expose the substrate at high temperature of more than 100–150 C., and resin plate of acrylic resin, polycarbonate or such can not be employed, due to its deforming. Referring to other methods, neither a method suitable to initialize the whole recording medium beforehand has been investigated, nor a method with high productivity has been found.

Referring to the idea to disperse the particles of recording material in the protection material, the present inventors tried to manufacture optical information recording medium in accordance with the method as publicized so far. They, too, however, could not get such enough improvement as expected, of repetition life of recording and erasing. This is because the constituent element of the storage medium is not dispersed as particles having desired composition and proper size, even if the elements could be dispersed into the base material. Thus, although the general idea of the structure of the optical information recording medium has been known, practical method of manufacturing the recording medium having such structure is not yet available.

As for the film-forming method for a thin layer, laser sputtering is known (Solid State Technology/December 1987 p.39–41). The laser sputtering, called also laser ablation or laser deposition, applies pulse laser of high energy density to a solid state target to form a layer on the opposite substrate. This method, unlike the usual sputtering, does not need plasma state, and has various favorable features, such as possible film formation in vacuum atmosphere. However, with relatively short history of development, laser sputtering is not yet established as reliable film-forming technology, and any attempt to apply this for the manufacture of optical information recording medium has not been reported.

Disclosure of Invention

An object of the present invention is to obtain optical information recording medium which is already initialized, or whose recording medium is already crystallized by the layer-formation.

Another object of the present invention is to provide method of manufacturing optical information recording medium which is easily initialized in layer-forming process.

Still another object of the invention is to obtain an optical information recording medium, in the protection material of which recording material is formed as particles having desired shape and dispersion to have long life for repetition of recording and erasing, and further to offer method of manufacturing so as to form recording material with desired shape and dispersion in a protection material.

In order to attain the above first object, according to the invention, recording layers of optical information recording medium of phase change type is formed by laser sputtering, in which, preferably, the recording layer is formed as crystallized state, the most frequent diameter of the crystal being less than 50 nm. Also, preferably, the recording layer is formed in vacuum under 50 mTorr, or in inert gas atmosphere, or in nitrogen atmosphere under 0.3 mtorr. Further, preferably, the main constituent of the recording layer is any one of Te compound, In—Sb, In—Sb—Te, and In—Se. Still further, preferably, the main constituent of the recording layer is Ge—Sb—Te, and, preferably, the composition being $Ge_xSb_yTe_z$, where $0.10 \leq x \leq 0.35$, $0.10 \leq y$, $0.45 \leq z \leq 0.65$, $x+y+z=1$.

Also, according to the invention, recording material of the optical information recording medium of phase changing type consisting of mixture of the protection material and recording material, is formed by laser sputtering, in which, preferably, recording material is formed as particles, the most frequent diameter of which being less than 50 nm. Preferably, the main constituent of the recording layer is any one of Te compound, In—Sb, In—Sb—Te, and In—Se. Still further, preferably, the main constituent of the recording layer is Ge—Sb—Te, and, preferably, the composition being $Ge_xSb_yTe_z$, where $0.10 \leq x \leq 0.35$, $0.10 \leq y$, $0.45 \leq z \leq 0.65$, $x+y+z=1$.

Also, the optical information recording medium according to the invention, is provided with at least the first protection layer on a substrate, recording material particles laid discontinuously on the first protection layer, and the second protection layer formed so as to adjoin both the first protection layer and recording material particles. In this case, preferably, particles of the recording material is formed by laser sputtering, the most frequent diameter of the particles of recording material, preferably, being less than 50 nm. Further, melting and softening temperatures of the protection layer is higher than the melting point of the recording material particles. Also, preferably, the main constituent of the recording layer is any one of Te compound, In—Sb, In—Sb—Te, and In—Se. Still further, preferably, the main constituent of the recording layer is Ge—Sb—Te, and, preferably, the composition being $Ge_xSb_yTe_z$, where $0.10 \text{—} x \text{—} 0.35$, $0.10 \leq y$, $0.45 \leq z \leq 0.65$, $x+y+z=1$.

The above described present invention not only relates to an optical information recording medium having characteristics not expected before, but includes method of manufacturing.

Owing to the above described construction, 1) Forming of the recording layer of crystal state become possible or easy. and, as the results, new optical information recording medium is obtained, for which no initialization or crystallization treatment after the formation of the recording layer is necessary, and, on the other hand, manufacturing process of the optical information recording medium is simplified, and the manufacturing cost is reduced. 2) The recording material is formed, in the protection material, in particle state with desired size and dispersion state, resulting in considerable improvement of repetition life of recording and erasing.

BEST MODE FOR CARRYING OUT THE INVENTION

Referring to the drawings, the present invention is explained as follows.

Figure 1:
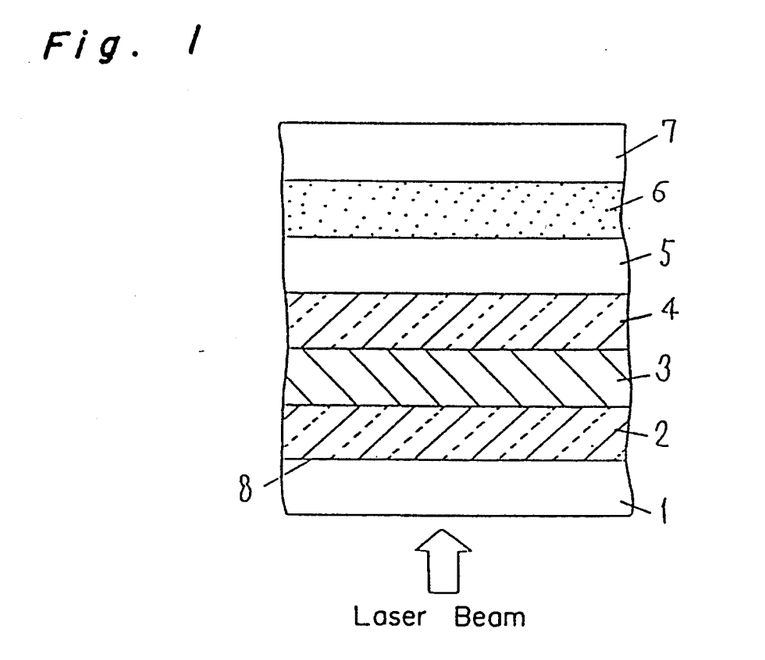
FIG. 1 is a section showing typical construction of the optical information recording medium according to the present invention.

Typical structure of the recording medium of the present invention is shown in FIG. 1(section). The laser beam for the recording, reproduction, and erasing is applied from the side of the substrate 1.

As the substrate 1, employed are resins such as PMMA, polycarbonate, or glass with flat and smooth surface. In the case of optical disk, the surface 8 of substrate is usually covered with spiral track or tracks in the form of concentric circles to lead laser beam.

As for the material for the protection layer 2 and 4, it is desirable that the material is stable physically and chemically, i.e., the material has melting or softening temperature higher than the melting temperature of the recording material, and does not make solid solution with the recording material. The protection layer does not need to be either dielectric or transparent, so that it can be made with, for example, ZnTe which absorbs visible and infrared rays. Further, if the protection layer 2, 4 are formed with different materials, advantage of large freedom, thermal and optical, of the design of disk is obtained. Of course, they can be made of the same material.

The recording layer 3 is made by laser sputtering, and is formed in crystal or state of state of more advanced ordering than the amorphous state. As the laser source, excimer laser, $CO_2$ laser. or such is used. The recording layer 3 consists of a material which changes its structure reversely between crystal state and amorphous state, for example, phase changing material including Te, In, or Se as its main constituent, a material which changes its structure reversely between two different crystal structure, for example, phase changing material including Te, In, or Se as its main constituent, or a material which changes its phase between two different crystal structure. The inventors have discovered that a thin layer of crystal state having nearly the same constituent as the target can be formed by laser sputtering with sputter target having phase change type recording material constituent, including Te, In or such, as its main constituent, which are, according to the conventional method of manufacturing of thin layer, not formed to layer of the state other than the amorphous state. Exploiting this characteristics, initialization simultaneous as the recording layer formation becomes possible, without exposing the substrate in high temperature, and a new optical information recording medium is obtained, which is easy to initialize and of superior repetition characteristics for recording and erasing.

The reflection layer 5, consisting of a metal element such as Au, Al, Ni, Fe, Cr, Ti, etc., or an alloy of these, serves for increasing the efficiency of light absorption to the recording layer. Alternatively, structure without any reflection layer 5 is possible, by employing a means to increase light absorption efficiency, for example, by making the recording layer thick.

The protecting substrate 7 is made by spin coating of resin, or by sticking resin plate, glass plate, or metal plate, similar to the substrate, with adhesive 6. Further, a structure is possible, in which two pairs of media are sticked together with a middle substrate or reflection layer therebetween, to make the recording, reproduction, and erasing on the both sides possible.

Figure 2:
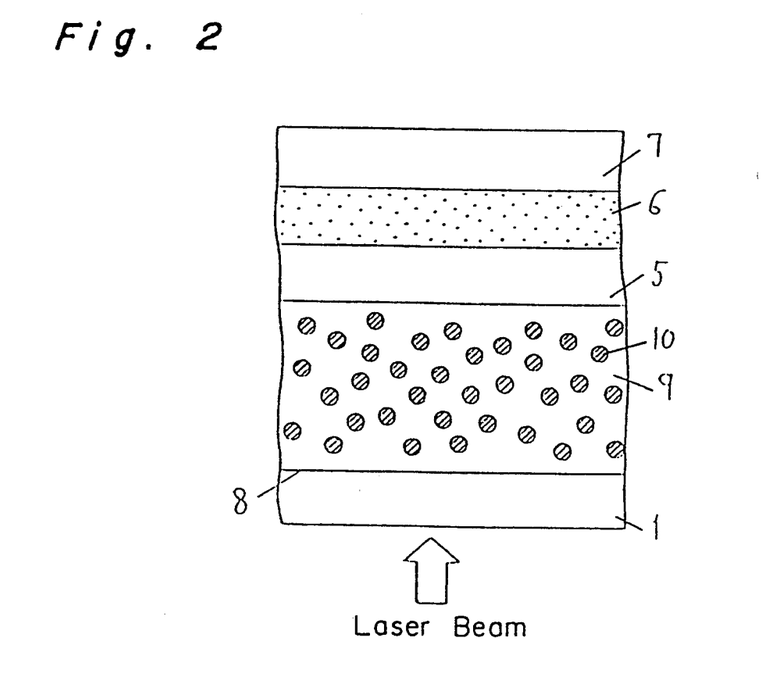
FIG. 2 is a section showing typical structure of the optical information recording medium having a recording layer consisting of recording material dispersed in the protection layer material.

Besides, by using laser sputtering, recording material could be formed in particle state. Exploiting this character, an optical information recording medium having a recording layer consisting of a protection material and recording material dispersed therein can be manufactured, which is impossible in the past. Typical structure (section) of the recording medium according to the invention is shown in FIG. 2

Referring to the protection material 9, like the protection layer 2,4, it is desirable that it is stable physically and chemically, i.e., its melting or softening temperature is higher than the melting point of the recording material, and it does not make any solid solution with the recording material.

The recording material particles 10 are formed, similarly as the recording layer 3, by laser sputtering. The recording material particles consist of a material which make reversible structure change between the crystal state and amorphous state, for example, phase changing material having Te, In, or Se as its main constituent, or a material which makes reversible phase change between different two crystal structures.

The recording material and protection material are deposited simultaneously, to form mixed recording layer in which the recording material is dispersed in the protection material as particle state.

Further, the inventors discovered new manufacturing method to enclose the recording material of particle state in the protection layer material. That is, on the first protection layer on the substrate, the recording material whose optical characteristics is changed by irradiation of light is deposited in island-like state, followed by the formation of the second protection layer, to enclose the particles of recording material of desired constituent in the protection layer. Typical construction (section) of the recording medium in accordance with the invention are shown in FIG. 3 and FIG. 4.

The materials for the first protection layer 11, the second protection layer 12, and the protection layer 4 are desirable to be stable physically and chemically, i.e., they have melting or softening temperature higher than the melting point of the recording material, and they do not make any solid solution with the recording material.

The recording material particle 13 is formed by usual layer-forming method, for example, electron beam deposition or sputtering; Laser sputtering also does. The recording material particle consists of a material which make reversible structure change between crystal state and amorphous state, for example, phase changing material having Te, In, or Se as its main constituent, or a material which makes reversible phase change between two different crystal structure.

Figure 3:
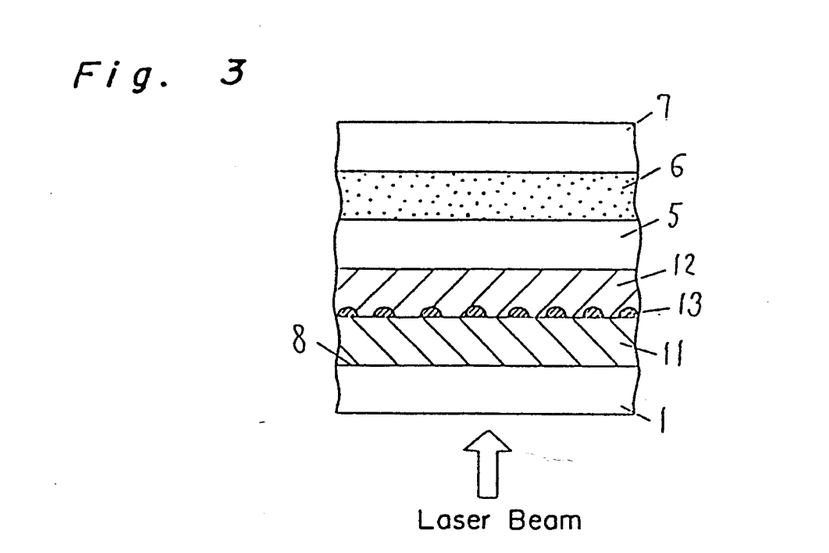
FIG. 3 and FIG. 4 are sections showing typical structure of the optical information recording medium having the first protection layer, island-like particles of recording material, and the second protection layer.
Figure 4:
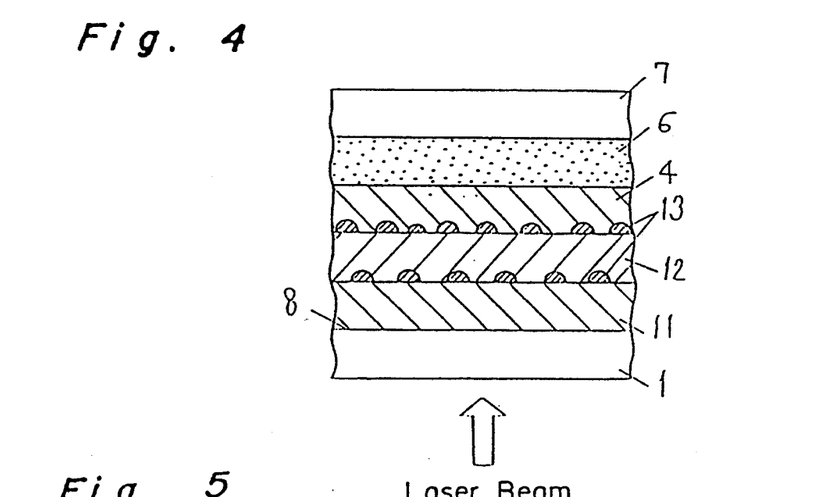

In the case of structure as shown in FIG. 3 and FIG. 4, the protection layer, recording material particles, and the protection layer are formed, in order, on top of the substrate, to enclose the particles of recording material in the protection layer. The optical information recording medium of such structure has considerable improvement of repetition characteristics of recording and erasing compared with conventional ones.

The structure to enclose recording material particles in the protection layer has various other advantages. For example, it is experimentally confirmed that the minute particles of recording material of amorphous state enclosed in the protection layer is superior in stability in amorphous state, than is held as continuous thin layer. The protection layer surrounding the particles of recording material works to prevent the crystallization of the recording material. This means the extension of freedom in selection of the recording material in designing disk. That is, in some cases, even the material, which can not be used for forming of the recording layer in thin layer state due to its inferior stability at amorphous state, can be used, if such structure as to enclose it as particles of the recording material in the protection layer is adopted.

In the case of structure to enclose the recording material particles in the protection layer, the particle size of the recording material particles is an important factor. If the particles of the recording material is too large, suppression mechanism against deterioration of repetition characteristics does not work.

Now, with some embodiments, the invention is explained in detail as follows.

(Embodiment 1)

As the recording layer material, $Ge_2Sb_2Te_5$ is selected, and the difference of quality of layer due to the difference of the method of layer-forming is examined. As the methods of layer-forming, selected are three methods; laser sputtering, electron beam method, and RF magnetron sputtering. Employing glass plate of 3 inch diameter as the substrate, and by the above described layer-forming method, recording layers of 30 nm thick each are formed.

Figure 5:
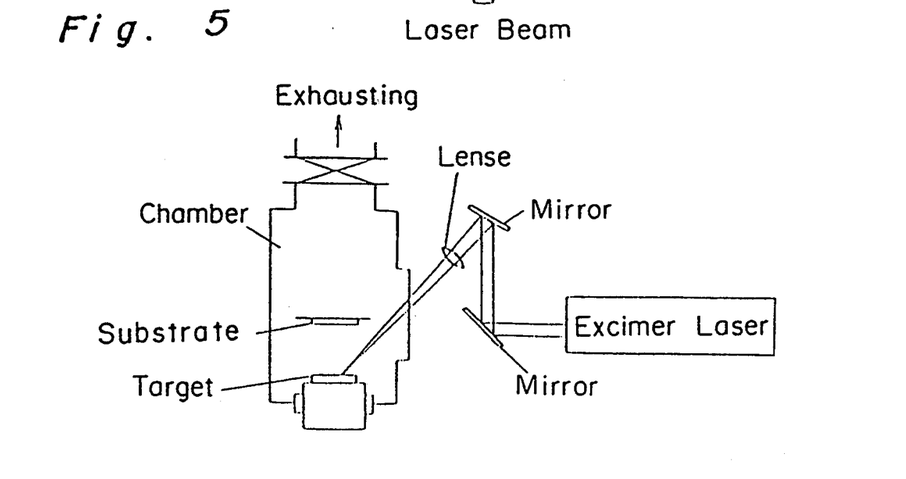
FIG. 5 is a structure diagram of the laser sputtering apparatus employed in the experiment.

In FIG. 5, the structure of laser-sputtering apparatus used for the formation of the recording layer is illustrated. A vacuum chamber of 300 500 mm$\phi$ is provided with a target of 3 inch diameter and a substrate holder. As the laser beam source, an excimer laser (KrF wave length 248 nm) laid outside the chamber is employed, and the laser beam of energy 150 mJ is irradiated through the glass window and with incident angle 45° to the target. Repetition of the pulse is 10 Hz, and the width of pulse is 20 nm. In order to obtain uniform thickness of the layer all over the substrate, and to efficiently utilize the target, it is desirable to irradiated pulse laser scanning on the target. For example, by scanning 70% of the target surface with laser, the utility efficiency of target is improved up to 200 times, according to the present experiment.

The layer is formed, in vacuum atmosphere of 0.01 mTorr in the case of laser sputtering and electron beam deposition, and in Ar atmosphere of 3 mTorr in the case of RF sputtering. While the layer is formed, each substrate is kept at 50° C.

Of the $Ge_2Sb_2Te_5$ recording layer made by the above described layer forming method of three types, crystal structure is analyzed with an electron microscope of transmission type. Also, on the sample given heat treatment after layer forming, too, analysis of crystal structure is carried out. The heat treatment is made at 200° C. in Ar atmosphere for 10 minutes. As a result, the recording layer formed by laser sputtering is found to be composed of minute crystal particles of hexagonal structure. Also, by high resolving TEM pattern the particle diameter of the particle of the crystal is found to be about 10 nm. On the other hand, the recording layer formed by electron beam deposition and RF sputtering are found to be in amorphous state of electron-diffraction level. Further, it is found that, by heat treatment of 200° C., all recording layer become crystal of hexagonal structure, irrespective of the difference of layer-forming method.

Thus, only the recording layer of $Ge_2Sb_2Te_5$ formed by laser sputtering is formed in crystallized state. Regarding the process of layer forming by laser sputtering, detailed situation is not yet known, and the reason why the recording layer is formed in crystallized state is not clear. It is presumed that $Ge_2Sb_2Te_5$ jumps out from the target as minute particles keeping compound state and arrives, in that condition, at the substrate. In such a way, with no need of migration of atoms constituting the recording layer on the substrate, a recording layer in crystallized state is obtained. Accordingly, the recording layer is formed in crystallized state without heating the substrate to any high temperature, and application of resin plate as the substrate does not bring any trouble.

Further, applying laser sputtering, quick and less defective layer-forming became possible. Let's compare this with the conventional layer-forming method. For example, in case of electron beam deposition, quick layer-forming is possible, but defects such as splash are accompanied by. Conversely, while sputtering or CVD is a method with less defects, it has a shortcomings of slow speed of layer forming. With the above described laser sputtering apparatus, $Ge_2Sb_2Te_5$ recording layer is formed, and is found that super high speed layer-forming of more than 1 $\mu m/min$, with no defect, is possible. From the view point of high speed layer-forming, laser sputtering can be said useful not only for forming of the recording layer of phase changing type optical disk as typified by $Ge_2Sb_2Te_5$, but for the layer forming of the opto-magnetic disc, for example.

(Embodiment 2)

Sample discs with the recording layer formed by laser sputtering is made and their recording and erasing characteristics are examined by laser beam irradiation. On the substrate of PMMA of 1.2 mm thick and 3 inch diameter, stacked in order are the protection layer, $Ge_2Sb_2Te_5$ recording layer, protection layer, and reflection layer. The two protection layer sandwitching the recording layer is intended to protect the recording layer from thermal damage by repetition of recording and erasing, and the reflection layer is provided so that the recording layer efficiently absorbs the incident laser beam. The laser sputtering apparatus and the condition for layer forming are the same as that explained in Embodiment 1. The degree of vacuum in the chamber for layer-forming is 0.01 mTorr. The protection layer and reflection layer are formed with usual RF magnetron sputtering apparatus. The composition of the protection layer and reflection layer are ZnS-20 mol % $SiO_2$ and Au respectively.

The thickness of the recording layer is 30 nm. The thickness of the protection layer is so selected that the absorption of the recording layer (for the wave length of the laser beam irradiated for recording and erasing—in this case, 830 nm) is large, and that big amplitude of recording signal can be employed. Explaining numerically, the thickness of the protection layer is 12 nm for the substrate side, and 15 nm for the reflection layer side. The reflection layer is 50 nm thick.

As explained in Embodiment 1, the $Ge_2Sb_2Te_5$ recording layer is formed in crystallized state, so that no initialization after the layer-forming is necessary. The disk thus prepared is applied with repeated recording and erasing, by irradiating semiconductor laser beam of 830 nm wave length, while rotating the disk so as to have linear speed of 10 m/min at the incident point of the beam. On the disk with the above described structure, one-beam-overwriting by power modification of incident laser is possible. In this case, overwrite-recording are repeatedly carried out with 22 mW recording power, and 16 mW erasing power. C/N and erasing ratio are measured with two single frequencies of f=3.3 MHz, and f=1.3 MHz.

Figure 6:
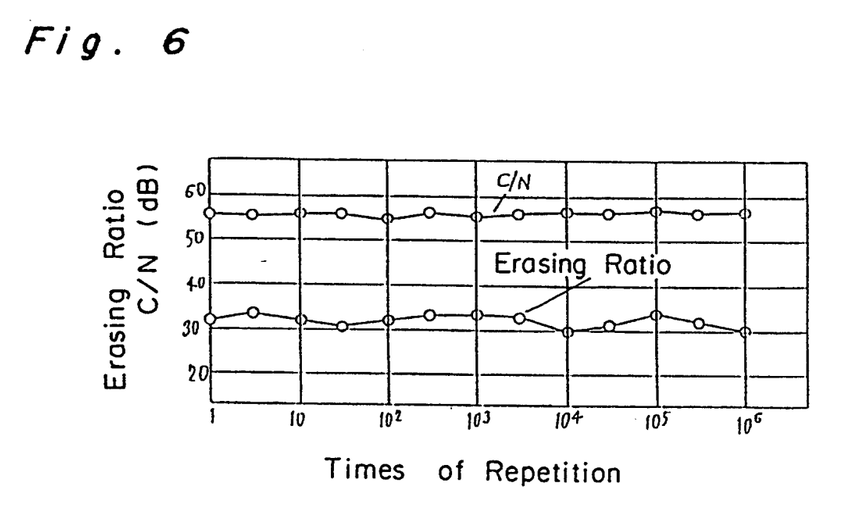
FIG. 6 is a diagram showing the repetition characteristics of recording and erasing of the optical information recording medium whose recording layer is formed by laser sputtering.

In FIG. 6, the relation between repetition of recording and erasing, and C/N or erasing ratio is given.

Figure 7:
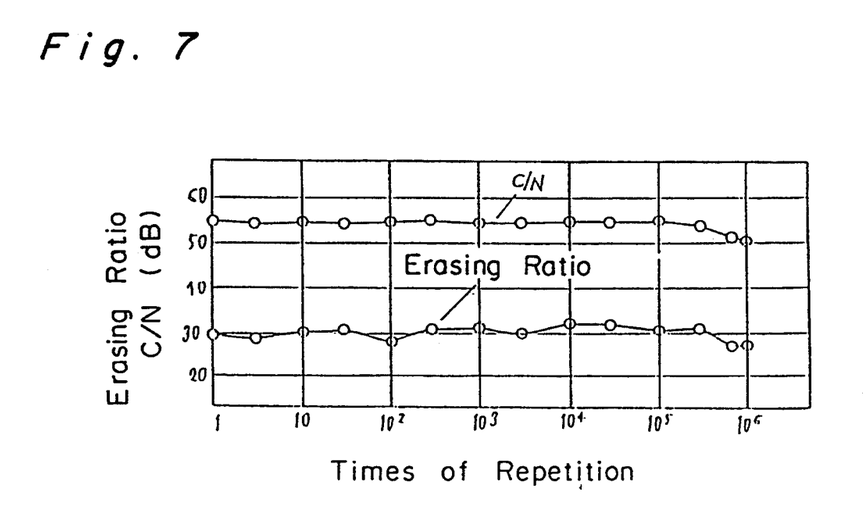
FIG. 7 is a diagram showing the repetition characteristics of recording and erasing of the optical information recording medium whose recording layer is formed by RF sputtering.

For comparison, in FIG. 7, of the disk with the recording layer formed by the usual RF magnetron sputtering apparatus, the relation between repetition of recording and erasing, and C/N or erasing ratio is shown. This disk is different from the disk whose data is shown in FIG. 6 in the method of the recording layer forming only, and otherwise the same, on the thickness and constitution of each layer, or condition of recording and erasing. The sputtering is carried out with 30 sccm flow of Ar and 3 mTorr pressure Ar. In case of the usual sputtering, $Ge_2Sb_2Te_5$ recording layer is formed in amorphous state, and, accordingly, before applying repeated recording and erasing, the whole surface of the disk is crystallized (initialized) by Ar laser.

As is observed in FIG. 6 and FIG. 7, the disk with the recording layer formed by laser sputtering does not suffer deterioration of C/N and erasing ratio even after one million times of recording and erasing, whereas the disk with the recording layer formed by usual RF sputtering becomes deteriorated by 0.7 million times of record repeating. The difference of deterioration by repetition between the two kinds of disks is presumed to depend on the difference of the volumes of gases introduced into the recording layers while being formed. While the laser sputtering carries out layer forming in vacuum atmosphere of 0.01 mTorr, the RF sputtering does it in 3 mTorr Ar atmosphere. In the case of RF sputtering, this Ar gas is presumed to be introduced into the $Ge_2Sb_2Te_5$ recording layer, becoming the cause of repetition deterioration.

TABLE 1

| Ar pressure (mTorr) | Repetition times C/N begins to deteriorate |
| --- | --- |
| 0.01 | more than one million times |
| 0.1 | more than one million times |
| 0.3 | more than one million times |
| 0.5 | more than one million times |
| 1 | one million times |
| 3 | one million times |
| 5 | 0.9 million times |
| 10 | 0.9 million times |
| 30 | 0.6 million times |

In order to make the situation clear, preparing the disks having the recording layers formed by laser sputtering, but under various atmospheric conditions, the relation between the repetition of recording and erasing, and C/N and the erasing ratio is investigated. In Table 1, the repetition times when C/N begins to deteriorate (defined as repetition times necessary for the initial C/N to fall 3 dB) for various Ar pressures are shown. It will be observed that the higher the Ar pressure the more remarkable the deterioration by repetition, at Ar pressure over 1 mTorr. Also, in case nitrogen is used as the atmosphere for the layer forming, it is found that, at more than 5 mTorr nitrogen pressure, the deterioration becomes more remarkable, as the nitrogen pressure increases.

As described above, one of the feature of the laser sputtering is the possible layer formation in vacuum atmosphere. Not only because the layer formation in vacuum is possible, but rather for suppressing the deterioration due to repetition, layer formation in vacuum atmosphere or in nitrogen or such inert gas atmosphere is to be positively employed. As the result of experiment and investigation, the degree of vacuum for the layer formation is found desirable to be less than 5 mTorr. Forming the recording layer under this condition, better repetition characteristics are obtained, than at the disk (with the same constituent of material, and the same layer thickness, but) formed by other method, for example, electron beam deposition, sputtering, or CVD.

However, as the result of more detailed investigation on the repetition characteristics of recording and erasing, and from the view point of power tolerance of recording and erasing showing favorable repetition characteristics, it is found experimentally that the favorable characteristics are obtained—the power tolerance is expanded 15% at the maximum—by the layer formation within atmosphere of 0.3 mTorr nitrogen pressure, rather than zero pressure. Why the power tolerance of recording and erasing is spread by laser sputtering in the atmosphere including slight amount of nitrogen is not clear at present. What is important is that the manufacturing method to form the recording layer by the laser sputtering in the atmosphere with less than 0.3 mTorr partial pressure of nitrogen is the very method to make the favorable optical record medium having wide power tolerance never obtained before, and that the recording medium thus obtained is easy to use for users, and is highly reliable.

(Embodiment 3)

In case of forming the recording layer by laser sputtering, the particle size of crystal of the formed layer can be controlled by changing sputtering condition, especially the strength of incident laser beam. Of the various sample disks having the $Ge_2Sb_2Te_5$ recording layer of different particle sizes, prepared by changing of condition of laser sputtering, the recording characteristics are explained in the following.

The structure of the sample disks is the same as that shown in Embodiment 2. The laser sputtering of the $Ge_2Sb_2Te_5$ recording layer is done in 0.01 mTorr vacuum atmosphere. In this case, the laser beam is irradiated, with repetition times fixed at 10 Hz, and pulse width fixed at 20 nsec, and with pulse energy changed from 100 to 400 mJ, and scanning with 45° incident angle with the target. The temperature of the substrate for layer-forming is kept at 50° C. In Table 2, the relation between the laser pulse energy of layer forming of the $Ge_2Sb_2Te_5$ recording layer and average crystal size of the thin layer of the $Ge_2Sb_2Te_5$ recording layer is given. The crystal size is measured by high resolution TEM observation, and looking into the crystal size distribution, the most frequent diameter is defined as the average particle diameter.

Of the various sample disks, thus prepared, and having the $Ge_2Sb_2Te_5$ recording layer of different average particle diameter, the relation between the average particle diameter of the recording layer and the C/N when recorded for the first time is also given in Table 2. The recording power is 22 mW, the bias power is 16 mW, and the recording frequency is 3.3 MHz. As is observed in Table 2, with the average particle diameter over 50 nm, C/N falls as the particle diameter increases. Investigating in more detail, the cause of the C/N deterioration is found due to the increase of N or the noise level. Thus, it is concluded that, when forming the layer of $Ge_2Sb_2Te_5$ recording layer by laser sputtering, favorable recording characteristics is obtained, by making the average diameter of the crystals below 50 nm.

TABLE 2

| Laser pulse energy (mJ) | Average particle diameter (nm) | C/N (dB) |
| --- | --- | --- |
| 100 | 6 | 56 |
| 150 | 10 | 57 |
| 200 | 15 | 57 |
| 250 | 30 | 55 |
| 300 | 50 | 50 |
| 400 | 70 | 46 |

(Embodiment 4)

Sample disks having the recording layer, whose constituent is represented by $Ge_2Sb_2Te_5$, and which is formed by laser sputtering, are prepared, and the crystallizing characteristics, amorphous characteristics, and repetition life of recording and erasing thereof are examined. The structure and layer forming condition of the samples are the same as that described in Embodiment 2.

As the result of the experiment, it is found, that sensitivity for both crystallization and amorphousization is favorable (considering overwriting by single beam, crystallizing speed is less than 100 nsec), that the recording layer of amorphous state can exist stably against thermal conditions, and that the range of three element system Ge—Sb—Te having favorable repetition life for recording and erasing is represented by $Ge_xSb_yTe_z$ where $0.10 \leq x \leq 0.35$, $0.10 \leq y$, $0.45 \leq z \leq 0.65$, $x+y+z=1$.

Figure 8:
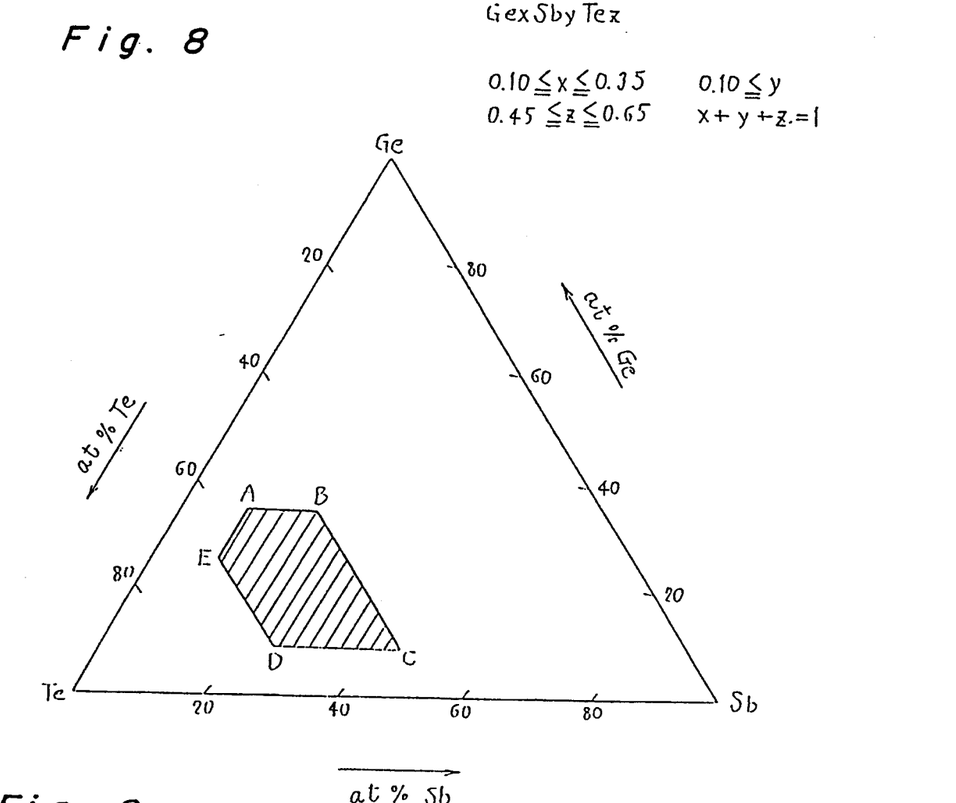
FIG. 8 is a diagram showing, regarding to 3 element system of Ge—Sb—Te, desirable range of composition for the recording material.

This constitution is shown, in FIG. 8, by the domain surrounded by A,B,C,D,E.

Thus experimentally obtained constitution of Ge, Sb, Te, of the recording layer is close to $(GeTe)_{1-\alpha}(Sb_2Te_3)_\alpha$ $0 \leq \alpha 1$ constitution having high crystallization speed, includes proper amount of Ge so as to be able to exist in amorphous state, and, being the constitution with good repetition characteristics by nature, can be formed to the recording layer in crystalline state by laser sputtering, of any constitution within the range.

(Embodiment 5)

In Embodiment 1,2,3 and 4, it is shown that, by forming the Ge—Sb—Te recording layer with laser sputtering, disks, needless to initialize and favorable in recording characteristics, can be obtained. Further, it is confirmed experimentally that the material having the above described advantages of laser sputtering layer formation is not confined to the recording material of Ge—Sb—Te constitution, but the advantages are common to the materials known as the recording layer material of phase change type for optical disks. By means of forming layer by laser sputtering, for example, Te—Ge, Te—Ge—Sb, Te—Ge—Sn, Te—Ge—Sn—Au, Sb—Te, Sb—Se—Te, In—Te, In—Se, In—Se—Tl, In—Sb, In—Sb—Se, In—Sb—Te, In—Se—Te, the recording layer with good ordered crystalline state than the one get by other layer-forming method are obtained. Especially, in the case of the recording layer with material constituent which is easily changeable reversibly between crystal and amorphous states by laser beam irradiation, the layer-forming in crystalline state is easily carried out by laser sputtering. Thus, by the manufacturing method to form the recording layer by laser sputtering, the optical disk of phase change type, needless to be initialized, can be made.

Further, the optical disk having the recording layer formed by laser sputtering and capable of repeated recording and erasing, is confirmed to be favorable in repetition characteristics, compared with the ones with the layer formed by other methods. However, the laser sputtering in low vacuum atmosphere did not bring improved repetition characteristics. As the result of experiment, it is found that favorable repetition characteristics is obtained, by forming the recording layer, in the atmosphere of vacuum of less than 0.5 mTorr, preferably less than 0.1 mTorr, or of nitrogen of less than 0.3 mTorr. In Table 3, as an example, of the optical disk having $In_{50}Se_{35}Tl_{15}$ recording layer capable of over-writing by one beam, applied with over-writing, the relation between the condition for layer forming of the recording layer and the repetition times until the C/N deteriorates 3 dB is shown. It is observed that the layer-formation in the vacuum atmosphere of less than 5 mTorr results in favorable repetition characteristics of recording and erasing.

Further more, it is found that the optical disk having the recording layer formed by laser sputtering can produce high quality signal i.e. high C/N, provided the crystal particle diameter of the recording layer is sufficiently small, preferably the average particle diameter of the crystals is smaller than 50 nm, regardless of the sorts of the recording layer.

TABLE 3

| Method and condition of recording layer forming RF sputter 100 | Times of repetition C/N begins to fall |
| --- | --- |
| Ar pressure 3 mTorr Laser sputter | 5000 times |

TABLE 3-continued

| Method and condition of recording layer forming RF sputter 100 | Times of repetition C/N begins to fall |
| --- | --- |
| Ar pressure 0.01 mTorr | 7000 times |
| Ar pressure 0.5 mTorr | 7000 times |
| Ar pressure 1 mTorr | 6000 times |
| N pressure 0.01 mTorr | 7000 times |
| N pressure 0.5 mTorr | 6000 times |
| N pressure 1 mTorr | 4000 times |

(Embodiment 6)

Of the disks having the mixed recording layer formed by simultaneously depositing the recording material and protection material, the repetition characteristics of recording and erasing is examined. In FIG. 2, typical structure (section) of the disk according to the invention is shown, and, in FIG. 9, the construction of the layer forming apparatus employed for the manufacture of the mixed recording layer is illustrated. The vacuum chamber is provided with two targets of 3 inch diameter, and a substrate holder. One of the targets serves as the cathode for usual RF magnetron sputtering, and the other target, being grounded, does not have the layer formation by RF sputtering.

Figure 9:
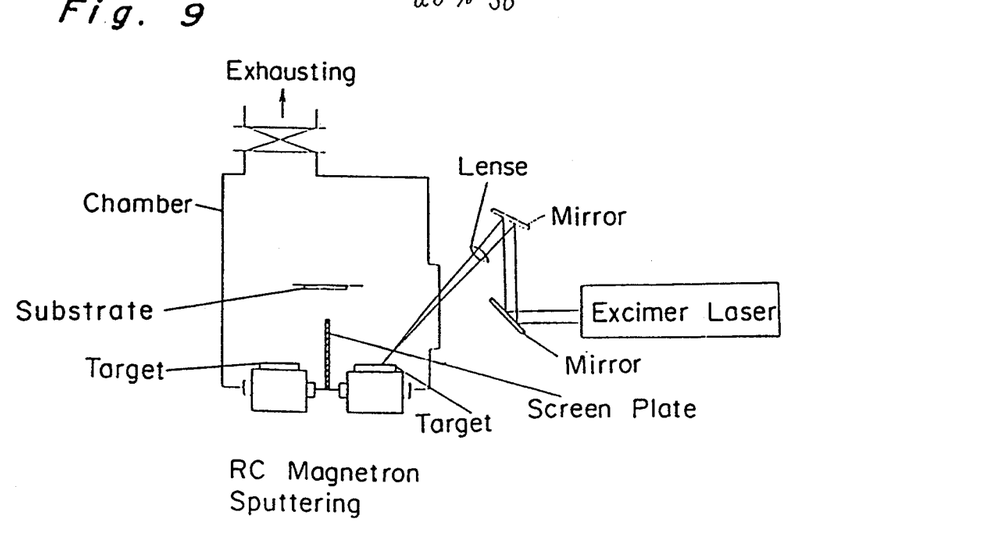
FIG. 9 is a structure diagram of the layer-forming apparatus as employed in the experiment.

Now, from the one target the protection material, and from the another target the recording material, are deposited at the same time onto the substrate, by RF magnetron sputtering and laser sputtering respectively. In this case, the volume ratio of the protection material and record material can be changed freely by adjusting the depositing rate thereof. For example, it is easy to change the volume ratio of them along the layer thickness at the forming stage of the mixed recording layer. When the volume of the recording material in the recording layer is small, it is confirmed that the recording material is dispersed as particles in the protection material.

In such a manner, by the codeposition by laser sputtering and RF sputtering, the recording material is easily deposited in particle state dispersed into the protection material. Three points are important here. The first point is that the recording material is deposited in particle state, without exposing the substrate in high temperature at the layer-formation. With the conventional manufacturing technology, the optical storage medium having the recording layer of such a structure is difficult to provide. By the use of the present novel manufacturing method, the recording material is deposited in particle state dispersed in the protection material, not only on the substrate of glass, but on the substrate of resin of low softening temperature, for example, of polycarbonate. The second point is that the particles of the recording material is formed in crystalline state, which is confirmed by X-ray diffraction. Thus, by employing laser sputtering, the particles of recording material are deposited in crystal state, without heating the substrate to high temperature, and, accordingly, as described above, the optical information recording medium with no need of initialization is obtained. The third point is that the formation of the protection material is not confined to RF magnetron sputtering. The forming of the recording material particles as described depends solely on the formation of recording material by laser sputtering. Therefore, for the forming of the protection material, various conventional method of layer-formation, for example, electron beam sputtering, can be used, or, the laser sputtering, too, can be applied for this purpose.

In the following, the results for the recording medium with $Sb_2Te_3$ as the recording material, and ZnS-20 mol % $SiO_2$ as the protection material, as an example, is described.

The substrate is of glass, and of 3 inch diameter. As the reflection material, Au is employed.

The layer-formation of the mixed layer of the protection material and recording material is made in Ar atmosphere. For forming ZnS-20 mol % $SiO_2$ layer, RF magnetron sputtering is applied. For the forming of the $Sb_2Te_3$ recording material, use is made of the excimer laser (KrF wave length 248 nm) laid outside the chamber, and the laser beam is irradiated through the glass window of the chamber with incident angle of 45° with the target. The number of times of the pulse repetition is 10 Hz, and the pulse width is 20 nsec. As explained in Embodiment 1, the laser pulse is made to scan the $Sb_2Te_3$ target, with the object of target utility efficiency improvement and so on. The temperature of the substrate, while the layer is formed, is kept at 50° C. Between the both targets, a screen plate is provided, so that the targets do not soil each other.

Of the recording material particles, the particle diameter and the distribution can be controlled mostly by the power of irradiated laser beam. When irradiated with energy of 100 mJ, the recording material is dispersed in particle state of 20 nm average diameter in the protection material.

Of the mixed recording layer, the layer thickness and the volume ratio of recording material in the mixed recording layer is so selected, that the light absorption (for the wave length of the laser beam for recording and erasing—in this case 830 nm) of the recording material is large, and that large amplitude of the record signal is possible. Explaining in detail, a sample disk is provided, by laying first the ZnS-20 mol % $SiO_2$ protection layer of 200 nm thick, and laying secondly the mixed layer of 100 nm thick thereupon by the simultaneous deposition by usual sputtering and laser sputtering, and laying thirdly thereon further the reflection layer of 50 nm thickness using usual sputtering technology. The mixed layer thereof consisted of the protection material and recording material of 9:1 volume ratio.

Of the above described optical disk, repetition characteristics of recording and erasing is examined. The laser beam for the recording, erasing, and reproduction is of 830 nm wave length, and relative speed between the incident laser beam and disk is 10 m/sec.

Figure 10:
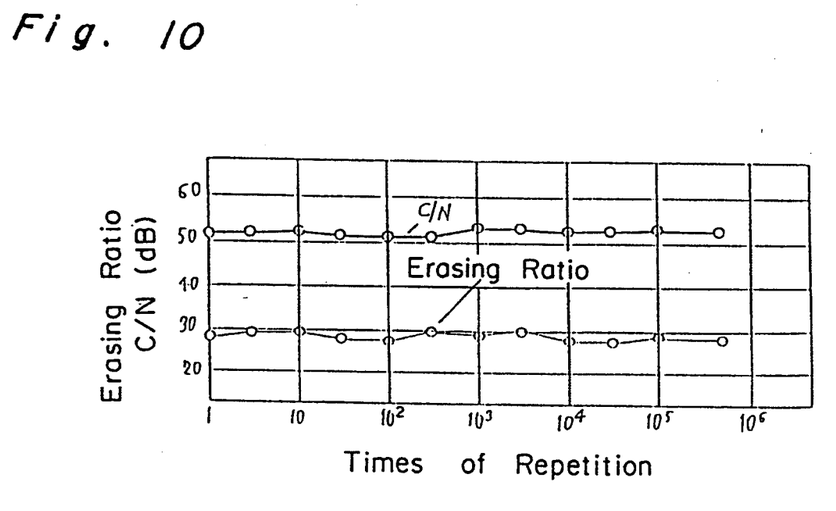
FIG. 10 and FIG. 12 are diagrams showing repetition characteristics for recording and erasing of the optical information recording medium whose particles of recording material is formed by laser sputtering.

In FIG. 10, the changes of C/N and the erasing ratio against the repeated overwriting is given. The C/N and erasing ratio are measured with two single frequency; f=3.3 MHz, f=1.3 MHz. After 0.5 million times of repetition of recording, deterioration of the erasing ratio is not observed. Further, similar sample disk of polycarbonate substrate is prepared and applied with repeated overwriting. In this case, too, similarly as the glass substrate, after 0.5 million times of repeated recording, C/N and the erasing ratio did not change.

Thus, according to the invented manufacturing method to form the protection material and recording material at the same time, not only the optical recording medium with favorable repetition characteristics is obtained, but also reduction of layer forming process, or of disk manufacturing cost becomes possible.

(Embodiment 7)

Of the disk having such structure as the recording layer is formed with the same protection material and recording material as that used in Embodiment 6 but of continuous type as the conventional ones, and is sandwitched by the protection material, the repetition characteristics of recording and erasing is examined. By comparing the results of the present embodiment with that of Embodiment 6, the advantages of the invention will be made clear.

In FIG. 1 is shown the structure of disk. The substrate is of glass, and of 3 inch diameter. The recording layer consisting of $Sb_2Te_3$ and being of continuous structure is sandwitched by two protection layers of ZnS-20 mol % SiO, and is further provided with Au reflection layer. The thickness of the recording layer is 30 nm, and the thickness of the protection layer is so selected, that the light absorption (for the wave length of the laser beam for recording and erasing—in this case 830 nm) of the recording material is large, and that large amplitude of the record signal is possible. Explaining in detail, the protection layer of the substrate side is of 100 nm thick, and that of the reflection layer side is 15 nm thick. The reflection layer is 40 nm thick. For the forming of the recording layer, protection layer and reflection layer, usual sputtering is employed.

Of the above described optical disk, the repetition characteristics are examined. The laser beam used for the recording, erasing and reproduction is of 830 nm wave length, and the relative speed between the incident laser beam and the disk is 10 m/sec. C/N and the erasing ratio are measured with two single frequencies; f=3.3 MHz, f=1.3 MHz. After repetition of 50 thousand times of overwriting, C/N decreased more than 3 dB from the initial value, and favorable repetition characteristics is not obtained.

(Embodiment 8)

In the specification of Patent Gazette of Japanese Patent Laid-open No. Sho 57-208648, or Sho 62-226438, various layer-forming method intending to disperse the recording material into the thermally stable protection layer is shown. In the Embodiment 8, with the intention to have the recording material dispersed in the protection material by using the conventional manufacturing method and the same protection material and recording material as those in Embodiment 6, simultaneous deposition of the protection material and recording material is carried out. Of this disk having the mixed recording layer, repetition characteristics for recording and erasing is examined. At present, as the typical one, only on the case of forming the mixed recording layer by simultaneous high frequency sputtering of two elements is explained. By comparing the results of this embodiment and those of Embodiment 6, the advantage of the invention is made clear.

Of the mixed layers formed by simultaneous high frequency sputtering from two elements with varied high frequency power applied to the $Sb_2Te_3$ target and ZnS-20 mol % SiO target, the relation between the optical characteristics and the volume ratio of $Sb_2Te_3$ recording material is examined. As the result, it is found that, provided the volume ratio of the $Sb_2Te_3$ recording material in the mixture is less than 20%, the recording material in the mixed layer could not be crystallized, even if the laser beam is applied with variously changed condition. Then, making various optical disks having the mixed layer of the protection layer and recording material as obtained by the above described method, the repetition characteristics of recording and erasing is examined. Of the disk having the mixed layer of which the volume ratio of the Sb$_2$Te$_3$ recording material is 20%, C/N deteriorated by repeated overwriting of several hundred times.

It is difficult to directly observe the aspect of dispersion of the recording material in the protection layer. However, of the disks with the mixed layer of the protection material and recording material, manufactured by any of the electron beam sputtering, sputtering, and ion plating, expected favorable repetition characteristics of recording and erasing is not obtained.

(Embodiment 9)

Disks are made with the same structure as those in Embodiment 6 but with the protection materials to enclose the recording material particles variously changed, and the repetition characteristics thereof is examined. As the result, in case the melting and softening temperatures of the protection material are lower than the melting point of the recording material, favorable repetition characteristics of recording and erasing is certainly not obtained. The protection materials which brought favorable repetition characteristics are the dielectrics such as Al$_2$O$_3$, SiO$_2$, SiO, Ta$_2$O$_5$, TeO$_2$, MoO$_3$, WO$_3$, ZnS, AlN, SiN, PbF$_2$, MgF$_2$, or the appropriate combination thereof.

The protection material is to be selected, noting not only the thermal and chemical stability, but the suitability of thermal conductivity and optical constants. For example, in order to get an optically superior disk—a disk having high absorption for the incident laser beam, and having large reproduction signal—the volume ratio of the recording material and the thickness of the mixed layer or such are to be decided, paying careful attention to the optical constants of the protection material and recording material.

(Embodiment 10)

Disks are made with the same structure as those in Embodiment 6 but with the recording materials to form the mixed recording layer variously changed, and the repetition characteristics thereof are examined. As the result, with any of the materials Te—Sb—Ge, Te—Ge, Te—Ge—Sn, Te—Ge—Sn—Au, Sb—Te, Sb—Se—Te, In—Te, In—Se, In—Se—Tl, In—Sb, In—Sb—Se, or In—Se—Te of proper constitution as the recording material, the formation of the layer of particle state is possible, provided the condition for laser sputtering especially the beam energy is selected suitably. Any of the disks thus obtained having the recording material of particle state showed favorable repetition characteristics of recording and erasing. Above all, that which showed generally excellent characteristics with respect to sensitivity of recording and erasing, thermal stability, repetition characteristics for recording and erasing, and other points is the case of application of three element system Te—Sb—Ge of suitable constitution ratio for the recording material. The constitution range showing favorable characteristics, as given experimentally using the sample disks of the said structure is found to be represented by Ge$_x$Sb$_y$Te$_z$, where $0.10 \leq x \leq 0.35$, $0.10 \leq y$, $0.45 \leq z \leq 0.65$, $x+y+z=1$.

This constitution is the domain surrounded by A, B, C, D, and E in FIG. 8. For any constituent within the range, the recording material particles can be formed in crystalline state by laser sputtering.

Similarly to the constitution of the recording material particle, the particle diameter, too, gives considerable influence upon the repetition characteristics. As the result of investigation on the combination of various recording materials and protection materials, the recording material particles having the most frequent diameter of less than 100 nm, preferably less than 50 nm, is found to give favorable repetition characteristics for recording and erasing.

Figure 11:
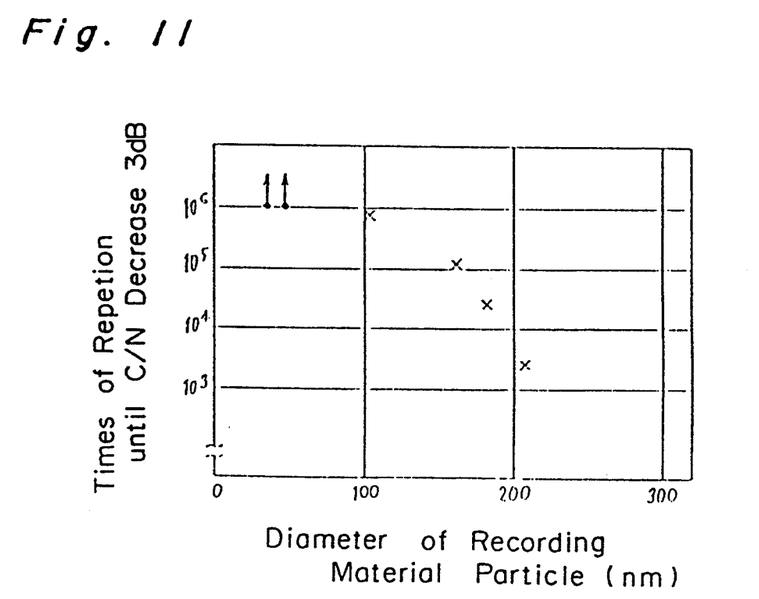
FIG. 11 and FIG. 14 are diagrams showing the relation between repetition life for recording and erasing and the most frequent diameter of the particles of recording material.

As an example, of the disk in which the recording material particles of Sb$_2$Te$_3$ are dispersed into the protection layer of ZnS-20 mol % SiO, with 10% volume ratio, and which is provided with an Au reflection layer, the relation between the diameter of the recording material particle, and repetition characteristics for recording and erasing is investigated. The result is shown in FIG. 11. The thickness of each layer is so selected that the light absorption of the recording layer (for the wave length of the laser beam irradiated for recording and erasing—in this case 830 nm) is large, and that adoption of large amplitude of the record signal is possible. The diameters of the recording material particles are estimated through observation by the transmission type electron microscope. As is seen from FIG. 11, favorable repetition characteristics for recording and erasing is obtained, for the most frequent diameter of the recording material particles less than 100 nm, preferably less than 50 nm.

(Embodiment 11)

An example of method to form the recording material dispersed in the protection material is explained in Embodiment 6. In the present Embodiment 11, another method to enclose the recording material particles in the protection material, different from that of Embodiment 6, is shown.

Of the optical disks, provided, upon the substrate thereof, with the first protection layer, island-like recording material, and the second protection layer, in this order, the repetition characteristics for recording and erasing are examined. In FIGS. 3 and 4, the typical structure of the disk according to the invention is shown. The each layer is formed by electron beam deposition, sputtering, ion plating, CVD, or laser sputtering. Especially, for forming the recording material particle, 1) deposition in atmosphere of low vacuum (0.1 mTorr order), 2) oblique deposition under high vacuum atmosphere below 1 mTorr, and 3) substrate heating, and 4) laser sputtering are effective.

In this case, the inventors applied the heating of the substrate for the formation of the recording material particles, in addition to other technologies, and, with 40° to 80° C. substrate, obtained considerable advantage. The diameter and distribution of the particles of the recording material are controlled by changing, for the most part, the substrate temperature. Thus, by applying the present manufacturing method, the recording material is easily formed to particle (island-like) state. The important point here is that the recording material could be made particle state, without heating the substrate to high temperature while being formed. Accordingly, the recording material is formed in particle state, not only on the glass plate but on the resin substrate with low softening temperature, for example, polycarbonate substrate.

In the following, is described the case, as an example, where the recording material particles of $Sb_2Te_3$ is enclosed between the first protection layer of ZnS-20 mol % $SiO_2$ and the second protection layer of ZnS-10 mol % $SiO_2$.

The substrate is of glass, and of 3 inch diameter. For the reflection layer, Au is employed.

The formation of the ZnS-20 mol % $SiO_2$ protection layer, and the reflection layer, is made by RF magnetron sputtering in Ar atmosphere. For the formation of the $Sb_2Te_3$ recording material, low pressure sputtering in Ar atmosphere is employed, the argon pressure being 0.3 Torr. The substrate is heated and kept at 50° C., while the recording material particles are being formed. The diameter and distribution of the recording material particles can be controlled mostly by adjusting the temperature of glass substrate. Of the island-like recording material particles, the mean diameter is 20 nm, and the mean height is 30 nm (as estimated through observation by the scanning type tunnel electron microscope).

The thicknesses of the first and second protection layer are so selected that the light absorption of the recording material particles (for the wave length of the laser beam irradiated for recording and erasing—in this case, 830 nm) is large, and that adoption of large amplitude of the record signal is possible. Numerically, the thicknesses of the first protection layer, second protection layer, and reflection layer are 200 nm, 45 nm average, and 40 nm respectively.

Of the disk described above, the repetition characteristics for recording and erasing is examined. The laser beam used for the recording, erasing, and reproduction is of 830 nm wavelength, and the relative speed between the irradiated laser beam and the disk is 10 m/sec.

Figure 12:
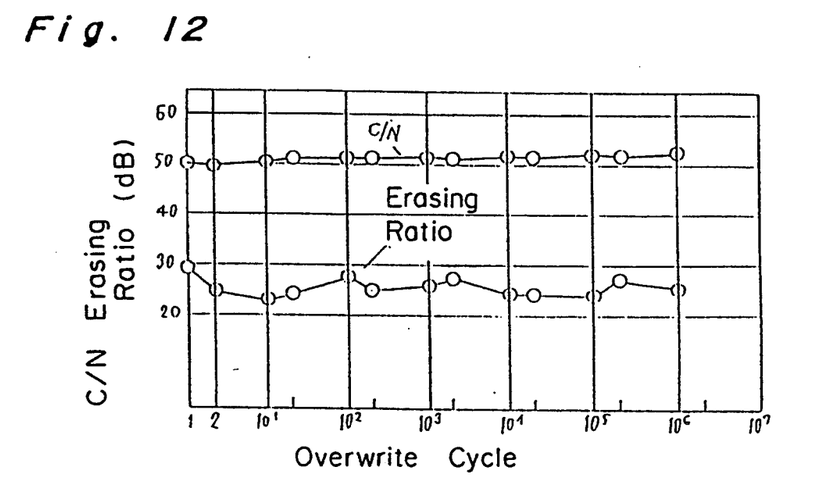

In FIG. 12, the variation of C/N and the erasing ratio against the repeated overwriting of signal is shown. The C/N and erasing ratio are measured with two single frequencies; f=3.3 MHz, f=1.3 MHz. Even after the one million times of repeated recording, any variation of C/N and the erasing ratio are not noted.

Further, preparing the similar sample disk with 3 inch diameter polycarbonate substrate, repeated overwriting is applied. In this case, too, after the repetition of recording of one million times, no variation of the C/N and erasing ratio is observed.

Thus, according to the manufacturing method of Embodiment 11, the optical storage medium with favorable repetition characteristics for recording and erasing, than that obtained by the manufacturing method shown in Embodiment 6 to form the protection material and recording material simultaneously, is obtained. The exact reason to produce the difference of repetition characteristics by the difference of the manufacturing method is not clear. However, it is presumed that there is a difference of bonding at the boundary surface of the recording material particle and protection material, between the both manufacturing method, and this gives influence upon the repetition characteristics.

(Embodiment 12)

Figure 13:
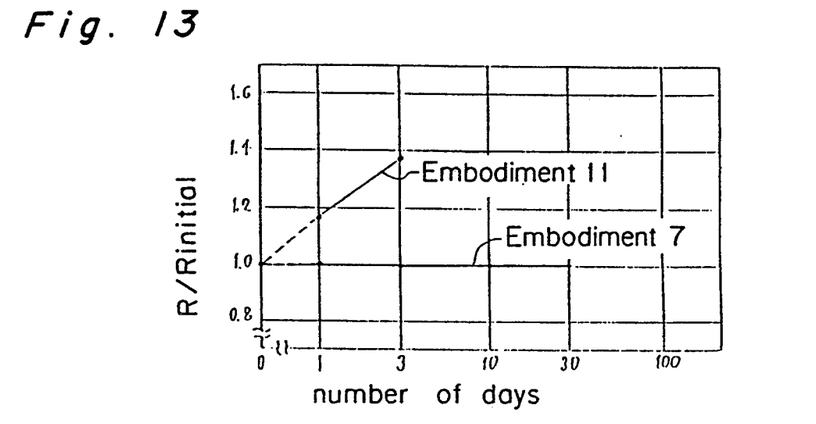
FIG. 13 is a diagram showing thermal stability of the optical information recording medium.

Of the disks shown in Embodiment 11 and 7, thermal stability is examined. Holding the both discs of non-recording state at 80° C., and projecting the light of 830 nm wavelength from the substrate side, the variation of reflectance is measured, of which the result is shown in FIG. 13. In case of the disk having the $Sb_2Te_3$ recording material enclosed in the protection layer, the reflectance does not change more than 30 days, whereas the disk with continuous $Sb_2Te_3$ recording layer has the reflectance varied (increased) in one day. This variation of reflectance corresponds to the phase change of the recording layer from amorphous to crystalline phase. In such a manner, even the recording material liable to crystalize, if it is enclosed as minute particles in the thermally stable protection layer, the stability at the amorphous state is improved.

(Embodiment 13)

Disks, with the same structure as those in Embodiment 11 but with the materials for the first and second protection layers changed variously, are prepared, and the repetition characteristics thereof are examined. As the result, in case the melting and softening temperature are lower than the melting point of the recording material, always, no favorable repetition characteristics for recording and erasing is obtained. The protection material producing favorable repetition characteristics is the dielectrics such as $Al_2O_3$, $SiO_2$, SiO, $Ta_2O_3$, $TeO_2$, $MoO_3$, $WO_3$, ZnS, AlN, SiN, $PbF_2$, $MgF_2$, or the proper combination thereof.

The protection layer material is to be selected, not only from the view point of thermal, chemical stability, but noting the adequateness of the thermal conductivity and optical constants. For example, in order to get an optically superior disk—a disk whose absorption for the incident light and whose reproduction signal are large—the thickness of each layer is to be decided, paying sufficient attention to the optical constants of the protection layer material. The material and thickness of the first and second protection layers can be selected independently, so that the disk characteristics becomes the most balanced, seen from the overall viewpoint. No doubt, the first and second protection layers can be made with the same material, provided the disk characteristics becomes balanced, from the overall viewpoint.

Further, by the idea, for example, as is shown in FIG. 5, to have the structure composed of the alternately stacked layers of the protection layer and recording material particles—substrate/protection layer/island-like recording material particles/protection layer/island-like recording material particles/protection layer/etc., the light absorption of the recording material can be increased. The advantage by the repeated structure on the optical design is considerable.

(Embodiment 14)

Disks, with the same structure as those in Embodiment 11 but with the recording material particles enclosed in the first and second protection layers variously changed, are prepared, and the repetition characteristics for recording and erasing is examined. As the result, it is found that, provided the recording material consists of any one of Te—Sb—Ge, Te—Ge, Te—Ge—Sn, Te—Ge—Sn—Au, Sb—Te, Sb—Se—Te, In—Te, In—Se, In—Se—Tl, In—Sb, In—Sb—Se, and In—Se—Te, of proper constituent, and provided the substrate temperature is adequately selected, the recording layer could be formed in particle (or island-like) state. Any disk, thus obtained, having the recording material of particle state, showed favorable repetition characteristics for recording and erasing. Especially, that showed superior characteristics regarding the recording and erasing sensitivity, thermal stability, repetition life for recording and erasing etc., is the case the Te—Sb—Ge three element system of proper constitution ratio is employed for the recording material.

The range of constituent showing favorable characteristics, as recognized experimentally by the sample disk of the above described structure, is found to be represented by $Ge_xSb_yTe_z$, where $0.10 \leq x \leq 0.35$, $0.10 \leq y$, $0.45 \leq z \leq 0.65$, $x+y+z=1$.

This constitution is the domain surrounded by A,B,C,D,E in FIG. 8.

Similarly as the constituent of the recording material particles, the particle diameter, too, gives the repetition characteristics big influence. Investigating on the combination of various recording materials and protection layer materials, it is found that favorable repetition characteristics for recording and erasing can be obtained, in the case the most frequent diameter of the recording material particles is less than 100 nm, preferably less than 50 nm.

Figure 14:
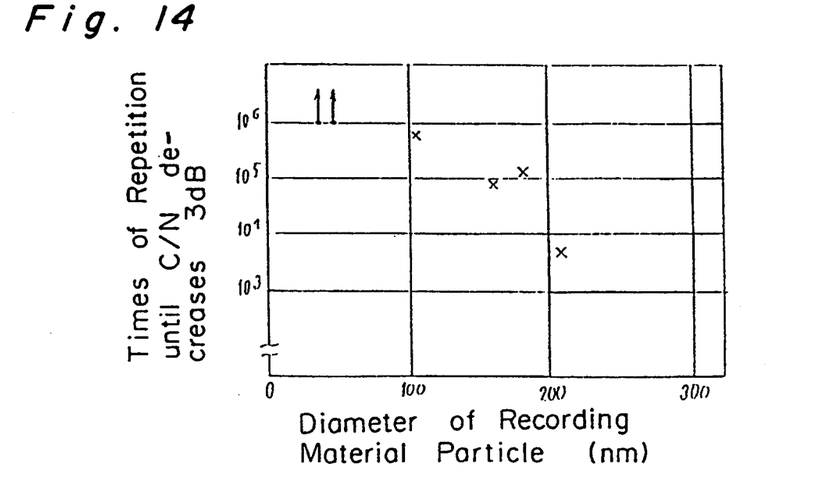

As an example, on the disk, having the recording material particles of Sb Te enclosed between the first protection layer of ZnS-20 mol % $SiO_2$ and the second protection layer of ZnS-10 mol % $SiO_2$, and provided with reflection layer of Au, the relation between the particle diameter of the recording material and the repetition characteristics of recording and erasing is examined. The result is shown in FIG. 14. The thickness of each layer is so selected that the light absorption of the recording layer is large, and the adoption of large amplitude of the record signal is possible. The diameter of the recording material particle is the value estimated through observation by the scanning type tunnel electron microscope. As is observed in FIG. 14, favorable repetition characteristics of recording and erasing is obtained in the case the most frequent diameter of the recording material particles is less than 100 nm, preferably less than 50 nm.

By the way, the method of forming the recording material particles is not confined to sputtering. The application of any of the electron beam deposition, ion plating, CVD, and laser sputtering, brought the improvement of the repetition characteristics of recording and erasing.

Industrial Applicability

As described above in detail, the optical information recording medium provided with, at least, the recording material particles formed by the laser sputtering on top of the first protection layer, and the second protection layer, has two characteristics, easy initialization and favorable repetition characteristics for recording and erasing, which are not obtained by any of the conventional methods.

We claim:

1. A method of manufacturing an optical information recording medium which is provided on a substrate with a recording layer comprising a material capable of being changed from an amorphous to a crystalline state by irradiation with a light beam, and which records, erases or reproduces information by irradiation with a light beam, characterized in that the recording layer is formed in a crystalline state by irradiation pulse laser scanning upon a solid target confronting the substrate and without heat treatment initialization.

2. A method of manufacturing an optical information recording medium according to claim 1, characterized in that the recording layer comprises crystal particles having a most predominant diameter of less than 50 nm.

3. A method of manufacturing an optical information recording medium according to claim 1, characterized in that the recording layer is formed in the an atmosphere of a vacuum or of inert gas of less than 0.5 mTorr.

4. A method of manufacturing an optical information recording medium according to claim 1, characterized in that the recording layer is formed in an atmosphere of nitrogen of less than 0.3 mTorr.

5. A method of manufacturing an optical information recording medium according to claim 1, characterized in that there is formed a recording layer, which includes, as its main constituent, a member selected from the group consisting of a Te compound, In—Sb, In—Sb—Te, and In—Se.

6. A method of manufacturing an optical information recording medium according to claim 1, characterized in that a recording layer is formed, which includes Ge—Sb—Te as its main constituent, and wherein the ratio of the constituents is in a range represented by $Ge_xSb_yTe_z$, where $0.10 \leq x \leq 0.35$, $0.10 \leq y$, $0.45 \leq z \leq 0.65$, $x+y+z=1$.

7. A method of manufacturing an optical information recording medium which is provided on a substrate with a recording material capable of being able to be reversibly changed between an amorphous and a crystalline state by irradiation with a light beam, and a protection material having melting and softening temperatures higher than the melting temperature of the recording material, and which records, erases, or reproduces information by irradiation with a light beam, characterized in that the recording material and protection material are formed simultaneously, and the recording material is formed in a crystalline state by a scanning pulse laser upon a solid target confronting the substrate and without heat treatment initialization.

8. A method of manufacturing an optical information recording medium according to claim 7, characterized in that the recording material in the mixed recording layer of the recording and protection material, is formed, so as to be dispersed in the protection material as particles having a most predominant diameter of less than 50 nm.

9. A method of manufacturing an optical information recording medium according to claim 7, characterized in that there is formed a recording material including, as its main constituent, a member selected from the group consisting of a Te compound, In—Sb, In—Sb—Te, and In—Se.

10. A method of manufacturing an optical information recording medium according to claim 7, characterized in that there is formed a recording material, including Ge—Sb—Te as its main constituent, and wherein the ratio of the constituents is in the range represented by $Ge_xSb_yTe_z$, where $0.10 \leq x \leq 0.35$, $0.10 \leq y$, $0.45 \leq z \leq 0.65$, $x+y+z=1$.

* * * * *

UNITED STATES PATENT AND TRADEMARK OFFICE
CERTIFICATE OF CORRECTION

PATENT NO. : 5,395,735
DATED : March 7, 1995
INVENTOR(S) : Kenichi NAGATA et al.

It is certified that error appears in the above-indentified patent and that said Letters Patent is hereby corrected as shown below:

Column 1, line 6, after "abandoned" insert -- which was the national stage of international application number PCT/JP90/01243--.

Signed and Sealed this

Sixteenth Day of January, 1996

Attest:

BRUCE LEHMAN

Attesting Officer

Commissioner of Patents and Trademarks